United States Patent
Lindberg et al.

(10) Patent No.: US 9,663,699 B2
(45) Date of Patent: May 30, 2017

(54) SUSPENSIONS FOR PROTECTING SEMICONDUCTOR MATERIALS AND METHODS OF PRODUCING SEMICONDUCTOR BODIES

(71) Applicant: OSRAM Opto Semiconductors GmbH, Regensburg (DE)

(72) Inventors: Gudrun Lindberg, Regensburg (DE); Mathias Kämpf, Burglengenfeld (DE); Kathrin Lampert, Ballstädt (DE)

(73) Assignee: OSRAM Opto Semiconductors GmbH (DE)

(*) Notice: Subject to any disclaimer, the term of this patent is extended or adjusted under 35 U.S.C. 154(b) by 0 days.

(21) Appl. No.: 15/053,646

(22) Filed: Feb. 25, 2016

(65) Prior Publication Data

US 2016/0177158 A1    Jun. 23, 2016

Related U.S. Application Data

(63) Continuation of application No. 13/398,992, filed on Feb. 17, 2012, now Pat. No. 9,303,178.

(30) Foreign Application Priority Data

Mar. 3, 2011 (DE) .................. 10 2011 012 923
May 5, 2011 (DE) .................. 10 2011 100 608

(51) Int. Cl.
*C09K 5/08* (2006.01)
*H01L 33/44* (2010.01)
*C09D 129/04* (2006.01)
*H01L 33/00* (2010.01)

(52) U.S. Cl.
CPC .............. *C09K 5/08* (2013.01); *C09D 129/04* (2013.01); *H01L 33/44* (2013.01); *H01L 33/0095* (2013.01)

(58) Field of Classification Search
None
See application file for complete search history.

(56) References Cited

U.S. PATENT DOCUMENTS

| 7,586,060 B2 | 9/2009 | Urairi et al. |
| 2003/0059540 A1 | 3/2003 | Berni et al. |
| 2005/0139962 A1 | 6/2005 | Dani et al. |

(Continued)

FOREIGN PATENT DOCUMENTS

| DE | 100 18 697 A1 | 10/2001 |
| DE | 10 2004 048 326 A1 | 7/2005 |

(Continued)

OTHER PUBLICATIONS

Tokyo Ohka Kogyo Co., Ltd., Material Safety Data Sheet: HogoMax LDG-T104, Jan. 16, 2009, pp. 1-7.

(Continued)

*Primary Examiner* — Alexander Ghyka
(74) *Attorney, Agent, or Firm* — DLA Piper LLP (US)

(57) ABSTRACT

A suspension for protecting a semiconductor material, comprising a carrier medium, trimethylolpropane as a plasticizer, benzotriazole derivate as an absorber dye, and inorganic particles selected from the group consisting of aluminum nitride, silicon nitride and boron nitride, wherein the thermal conductivity of the suspension is about 1 W/mk to about 2 W/mk.

7 Claims, 3 Drawing Sheets

(56) References Cited

U.S. PATENT DOCUMENTS

| | | | |
|---|---|---|---|
| 2007/0158623 A1* | 7/2007 | Sawaguchi | C08F 297/04 |
| | | | 252/582 |
| 2007/0221268 A1* | 9/2007 | Hasch | C08K 5/20 |
| | | | 136/251 |
| 2008/0271845 A1 | 11/2008 | Keite-Telgenbuscher et al. | |
| 2009/0050909 A1 | 2/2009 | Chen et al. | |
| 2009/0082240 A1* | 3/2009 | Nukui | G03F 7/425 |
| | | | 510/176 |
| 2009/0101238 A1 | 4/2009 | Jossick et al. | |
| 2009/0253231 A1 | 10/2009 | Okawa | |
| 2010/0181684 A1* | 7/2010 | Takahashi | C08L 63/10 |
| | | | 257/774 |
| 2011/0006668 A1 | 1/2011 | Hussell et al. | |

FOREIGN PATENT DOCUMENTS

| | | |
|---|---|---|
| WO | 99/48137 A2 | 9/1999 |
| WO | 2005/058767 A1 | 6/2005 |

OTHER PUBLICATIONS

Afouxenidis, Dimitrios et al., "ZnO-based Thin Film Transistors Employing Aluminum Titanate Gate Dielectrics Deposited by Spray Pyrolysis at Ambient Air," *ACS Applied Materials & Interfaces*, 2015, 7(13), pp. 7334-7341.

\* cited by examiner

SUSPENSIONS FOR PROTECTING SEMICONDUCTOR MATERIALS AND METHODS OF PRODUCING SEMICONDUCTOR BODIES

RELATED APPLICATIONS

This application claims priority of German Patent Application Nos. 10 2011 012 923.5, filed Mar. 3, 2011, and 10 2011 100 608.0, filed May 5, 2011, herein incorporated by reference.

TECHNICAL FIELD

This disclosure relates to suspensions for protecting semiconductor materials and methods of producing semiconductor bodies.

BACKGROUND

It could be helpful to find suspensions suitable, in particular, to protect chip regions against laser radiation and heat effects during laser separation methods. It could further be helpful to find improved methods of producing semiconductor bodies.

SUMMARY

We provide a suspension for protecting a semiconductor material including a carrier medium and inorganic particles.

We also provide a method of producing a semiconductor body including providing a semiconductor wafer having a separating region arranged between two chip regions, coating the semiconductor wafer with a suspension layer formed from the suspension, and separating the semiconductor wafer along the separating region with a laser.

We further provide a suspension for protecting a semiconductor material including a carrier medium, inorganic particles, said inorganic particles are at least one selected from the group consisting of titanium oxide, zinc oxide, aluminum nitride, silicon nitride, boron nitride, nitride, ceramic and metal, and a plasticizer.

We yet further provide a suspension for protecting a semiconductor material including a polymeric matrix as carrier medium, inorganic particles, and at least one of an absorber dye or a plasticizer.

DETAILED DESCRIPTION

Figure 1:
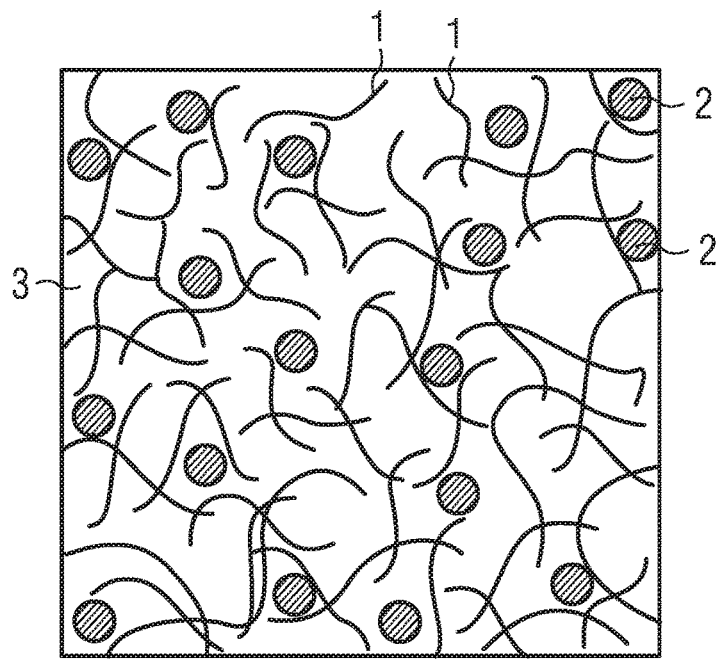
FIGS. 1 and 2 each show a schematic illustration of a suspension.

It will be appreciated that the following description is intended to refer to specific examples of structure selected for illustration in the drawings and is not intended to define or limit the disclosure, other than in the appended claims.

We provide suspensions for protecting semiconductor wafers comprising, in particular, a carrier medium and inorganic particles. The carrier medium is particularly preferably a polymeric matrix in which the inorganic particles are introduced. A suspension comprising a polymeric matrix as a carrier medium can also be a protective lacquer.

The suspension is generally applied to the semiconductor surface in the form of a layer prior to the processing thereof.

The suspension is provided, in particular, to protect the semiconductor material during a laser separation method. Furthermore, it is possible to use the suspension to protect a semiconductor surface during a plasma or sputtering method.

Addition of the inorganic particles results in improved heat dissipation in the processed semiconductor material. This effect leads to the suspension exhibiting reduced shrinkage and peeling behavior, for example, during the laser separation process. Slag residues can thus be removed by cleaning away the suspension by lift-off in a manner free of residues. Particularly preferably, the suspension can be completely removed again from the semiconductor surface after the laser separation process.

With the aid of the inorganic particles in the suspension, chip-damaging influences as a result of stray radiation and heat accumulation during laser separation can advantageously be reduced. In this case, the particles can, on the one hand, function as diffuse scattering centers of deflected laser radiation and, on the other hand, attenuate the intensity of the scattered laser radiation by absorption effects.

Furthermore, addition of inorganic particles advantageously results in an increased thermal conductivity with at the same time reduced heat capacity of the suspension. Heat accumulation in or under the suspension layer as a result of the heat input during laser separation can thus additionally be reduced.

The thermal conductivity of the suspension is particularly preferably about 1 W/mK to about 2 W/mK. By comparison with conventional protective lacquers without addition of inorganic particles, the thermal conductivity of which is generally approximately 0.3 W/mK, the thermal conductivity of the suspension comprising the inorganic particles is therefore surprisingly significantly increased.

If a polymeric matrix is used as carrier medium, then the polymeric matrix preferably comprises polyvinyl alcohol or consists of polyvinyl alcohol.

As a solvent, in particular for a polymeric matrix based on polyvinyl alcohol, the suspension preferably contains water and propylene glycol monomethyl ether (PGME).

The inorganic particles can, for example, contain at least one of the following materials or consist of at least one of the following materials: titanium oxide, zinc oxide, aluminum nitride, silicon nitride, boron nitride, nitride, ceramic, metal and the like.

The diameter of the inorganic particles is preferably 8 nm to 1 µm.

Particularly preferably, the proportion of inorganic particles in the suspension is about 1% by weight to about 60% by weight.

Furthermore, the suspension can comprise at least one of the following additives: absorber dye, plasticizer or the like. An absorber dye is suitable, in particular, for absorbing electromagnetic radiation from the desired wavelength range. A suitable absorber dye for absorbing UVA radiation can be, for example, a benzotriazole derivate (Uvinul, BASF), while Dioccylphtalak (DOP, dioctyl phthalate) or trimethylolpropane, for example, can be used as a plasticizer. The properties of a polymeric matrix as a carrier medium can advantageously be altered by the use of additives. A fungicide can also be added to the lacquer mixture for preservation purposes.

A cooling effect can generally take place with the use of additives such as plasticizers, for instance, by evaporation during heat input—for instance with a laser. In this case, the additive such as the plasticizer, evaporates during heat input, as a result of which a local cooling of the suspension layer and/or of the underlying semiconductor material takes place. Through the effect of evaporative cooling, the heat input into the semiconductor system is likewise reduced and component damage as a result of thermal degradation is thus advantageously counteracted.

The suspension need not be suitable for and/or need not be sintered.

The suspension is suitable, in particular, for use during a method of producing a semiconductor body.

Such a method may comprise the following steps:
providing a semiconductor wafer having a separating region arranged between two chip regions,
coating the semiconductor wafer with the suspension, and
separating the semiconductor wafer along the separating region with a laser.

The suspension can be applied to the semiconductor wafer by one of the following methods, for example: spraying, spin-coating, dipping or the like. In particular a dipping process can in this case also be carried out on a tray of semiconductor wafers.

The semiconductor wafer is particularly preferably coated completely with the suspension. In this case, a sufficiently thick multilayer structure composed of inorganic particles forms within the suspension layer, the structure suitable to at least reduce the chip-damaging influences of the laser radiation.

The suspension layer preferably has a thickness of about 20 nm to about 2 μm. Particularly preferably, the suspension layer is not thicker than about 1 μm.

The coating process can, if appropriate, be carried out a number of times successively to achieve a desired thickness of the suspension layer.

The suspension layer may be dried and/or baked after application to the semiconductor wafer. During this step, solvent is generally removed from the suspension. If the suspension contains a polymeric matrix as a carrier medium, then the matrix is preferably also cured during baking.

Particularly preferably, a nanosecond laser is used to separate the semiconductor wafer. The wavelength of the laser radiation can be in the red, green or ultraviolet spectral range. Examples of suitable nanosecond lasers for laser separation include those whose radiation has one of the following wavelengths: 1064 nm, 532 nm or 355 nm. The suspension layer may be absorbent and/or of a scattering type for the laser radiation. Particularly preferably, the suspension layer is non-transmissive to the laser radiation.

The suspension layer may comprise the polymeric matrix and the polymeric matrix may remain in the suspension layer.

Using the suspension, chip regions whose width is not greater than about 250 μm can preferably be separated from one another.

Furthermore, the suspension is preferably suitable for use during separation of chip regions which have light emitting diode structures. Light emitting diode structures contain an active zone suitable to generate electromagnetic radiation. In particular, the active zone is comparatively sensitive to external influences such as, for instance, heat input or stray radiation during laser separation.

The semiconductor wafer may comprise a semiconductor layer sequence comprising, alongside the active zone, an outermost layer having a high refractive index in comparison with an underlying layer, which preferably directly adjoins the outermost layer. The outermost layer and/or the underlying layer may preferably be formed both in the chip regions and in the separating regions.

The outermost layer can be a passivation layer, for example, provided to protect the subsequent light-emitting diode chips against external influences. Particularly preferably, the outermost layer is electrically insulated. The outer layer can, for example, comprise one of the following materials or be formed from one of the following materials: silicon nitride, silicon oxide or the like. The outermost layer has, for example, a refractive index of greater than about 1.

Preferably, the outermost layer covers the side areas of the chip regions at least in the region of the active zone. Particularly preferably, the outermost layer completely covers the side areas of the chip regions. The active zone can advantageously be protected as a result. An electrically insulating outermost layer generally also protects the active zone against short circuits.

The layer lying under the outermost layer can be a metallic layer, for example, provided to contribute to the electrical contact-connection of the subsequent semiconductor chips and/or the reflection of electromagnetic radiation generated in the active zone. The metallic layer need not necessarily be an individual layer, but rather can be constructed from different individual layers. The metallic layer or at least one of its individual layers may comprise, for example, one of the following materials or an alloy of these materials or consists of one of the following materials: platinum, gold, aluminum, titanium or the like. The refractive index of the metallic layer is in a range of greater than about 1, for example. The reflectivity of the metallic layer is preferably at least about 50%.

The suspension is suitable, in particular, for application to a semiconductor wafer during the laser separation of the semiconductor wafer comprising an above-described semiconductor layer sequence having an outermost layer having a high refractive index and an underlying layer having a comparatively low refractive index and/or reflective properties for the purpose of protecting the semiconductor wafer. During the laser separation of such a semiconductor layer sequence, it is possible for the laser radiation to experience total reflection within the outermost layer and thus be guided by a waveguide effect to the chip region and the active zone arranged there. In this way, the active zone, as a result of the laser radiation, can experience damage leading at least to impairment of the properties of the active zone.

If, however, before the laser separation method, a suspension comprising an additive composed of inorganic particles is applied to the surface of the semiconductor wafer, then laser radiation possibly coupled into the outermost layer may be scattered and/or absorbed at the inorganic particles and thus effectively attenuated. Damage to the active zone is therefore advantageously generally at least reduced during the laser separation method.

It should be pointed out that the term "semiconductor layer sequence" does not necessarily mean a layer sequence constructed only from semiconductor material. Rather, it is possible for the semiconductor layer sequence also to comprise metallic and/or oxidic layers. Furthermore, it is possible for the semiconductor layer sequence at least in places—for example, in the separating regions—to be constructed only from individual layers substantially free of a semiconductor material.

The separating region may be a sawing trench. A sawing trench generally has the form of a line.

If the semiconductor wafer comprises a semiconductor layer sequence having an active zone, then the separating region preferably completely severs the active zone.

Particularly preferably, the separating regions are a latticed grid.

After the semiconductor wafer has been singulated into individual chip regions, the suspension is particularly preferably removed again as completely as possible from the semi-conductor material. This can be done, for example, by high-pressure cleaning using a solvent.

Particularly preferably, the method is free of a sintering process, in particular a sintering process of the suspension layer.

Further advantages will become apparent from the selected representative examples described below in conjunction with the Drawings.

Elements that are identical, of identical type or act identically are provided with the same reference symbols in the Drawings. The Drawings and the size relationships of the elements illustrated among one another should not be regarded as to scale. Rather, individual elements, in particular layer thicknesses, may be illustrated with an exaggerated size to enable better illustration and/or to afford a better understanding.

The suspension in accordance with the example shown in FIG. 1 comprises a polymeric matrix as carrier medium 1, in this case polyvinyl alcohol, into which inorganic particles 2 are embedded. The inorganic particles 2 particularly preferably consist of titanium oxide. In this example, the proportion of inorganic titanium oxide particles is about 25% by weight. The suspension contains water as solvent 3.

Figure 2:
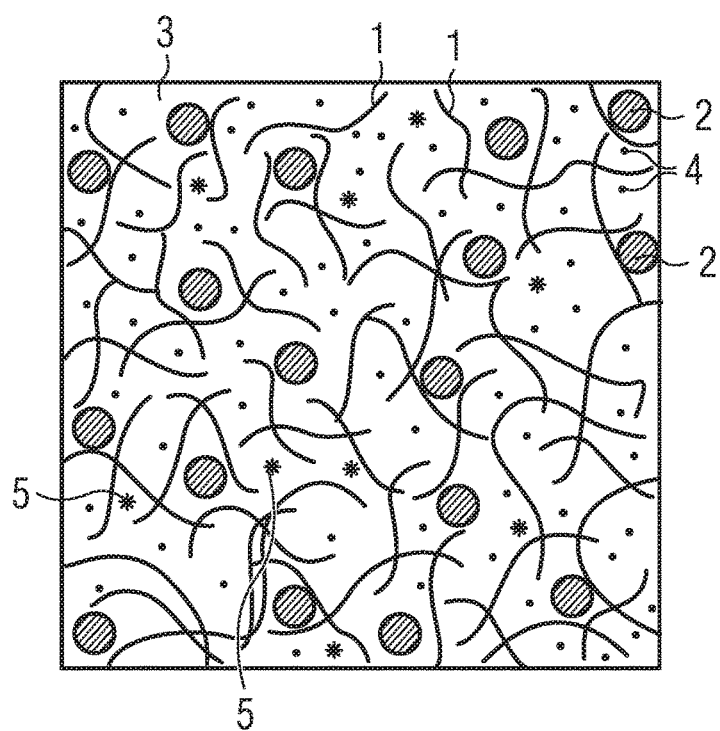

In contrast to the suspension in accordance with the example in FIG. 1, the suspension in the example in FIG. 2 comprises an absorber dye 4 and a plasticizer 5. Trimethylolpropane as plasticizer 5 and a benzotriazole derivative as absorber dye 4 are added to the suspension in the example in FIG. 2.

One example of a method of producing a semiconductor body is explained below with reference to FIGS. 3A to 3C.

Figure 3A:
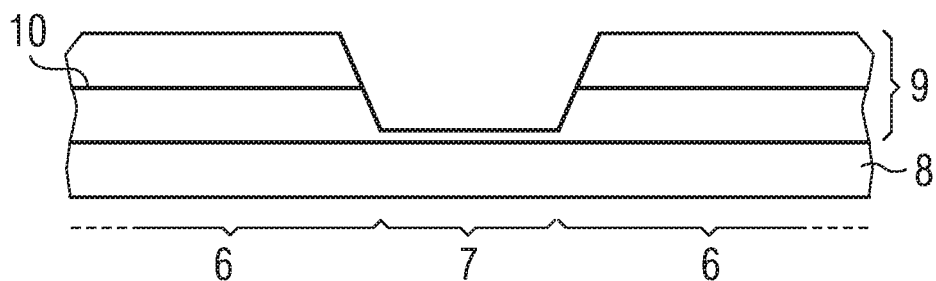
FIGS. 3A to 3C show schematic sectional illustrations of one example of a semiconductor wafer in different method stages.

FIG. 3A shows a schematic sectional illustration of a semiconductor wafer comprising two chip regions 6 between which a separating region 7 is arranged. The separating region 7 is a sawing trench. The semiconductor wafer comprises a substrate 8 on which substrate a semiconductor layer sequence 9 is applied. The semiconductor layer sequence 9 is an LED structure and has an active zone 10 that generates electromagnetic radiation. The semiconductor layer sequence 9 can furthermore comprise metallic layers and dielectric layers. Furthermore, a converter material can be arranged on a radiation exit area of the LED structure, the converter material suitable to convert electromagnetic radiation generated in the active zone 10 into radiation in a different wavelength range. The sawing trench severs the semiconductor layer sequence 9 and, in particular, the active zone 10.

Figure 3B:
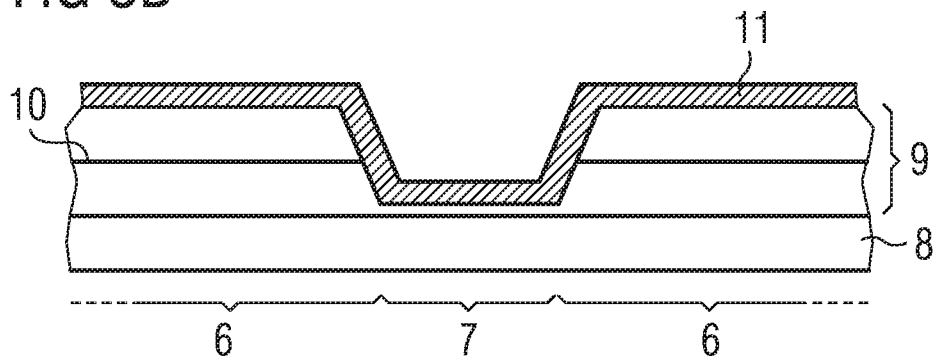

For the purpose of protection during a subsequent laser separation process, in a further method step, a suspension layer 11 is applied to the entire surface of the semiconductor wafer (FIG. 3B). The suspension layer 11 can be applied, for example, by spraying, spin-coating, dipping or the like. The thickness of the suspension layer 11 is preferably about 20 nm to about 2 µm.

In this case, the width of the chip regions 6 is not greater than about 250 µm.

Figure 3C:
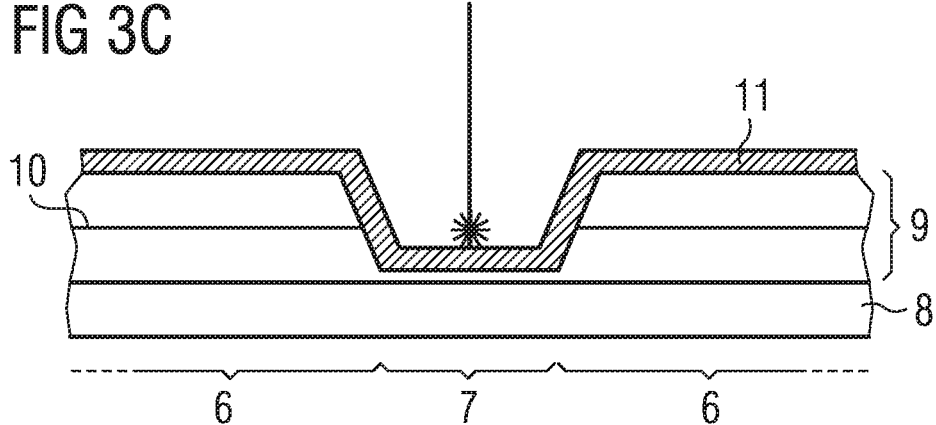

In a further method step, the chip regions 6 are then separated from one another by radiation from a laser guided within the sawing trench as shown in FIG. 3C.

Figure 4:
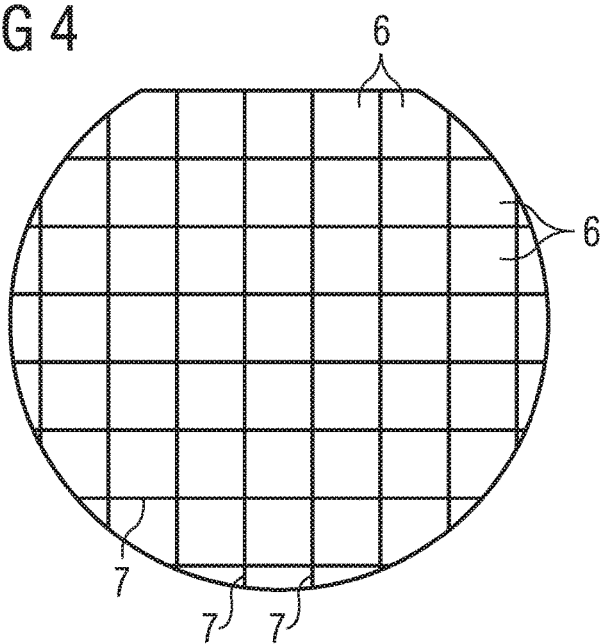
FIG. 4 shows a schematic plan view of an example of a semiconductor wafer.

FIG. 4 shows a schematic plan view of a semiconductor wafer surface such as has already been shown schematically in the sectional illustration for instance in FIG. 3A. The surface of the semiconductor wafer comprises a multiplicity of chip regions 6 separated from one another by grid-type separating regions 7, for instance sawing trenches. The semiconductor wafer can be singulated into separate chips by a method such as has already been described with reference to FIGS. 3A to 3C.

Figure 5:
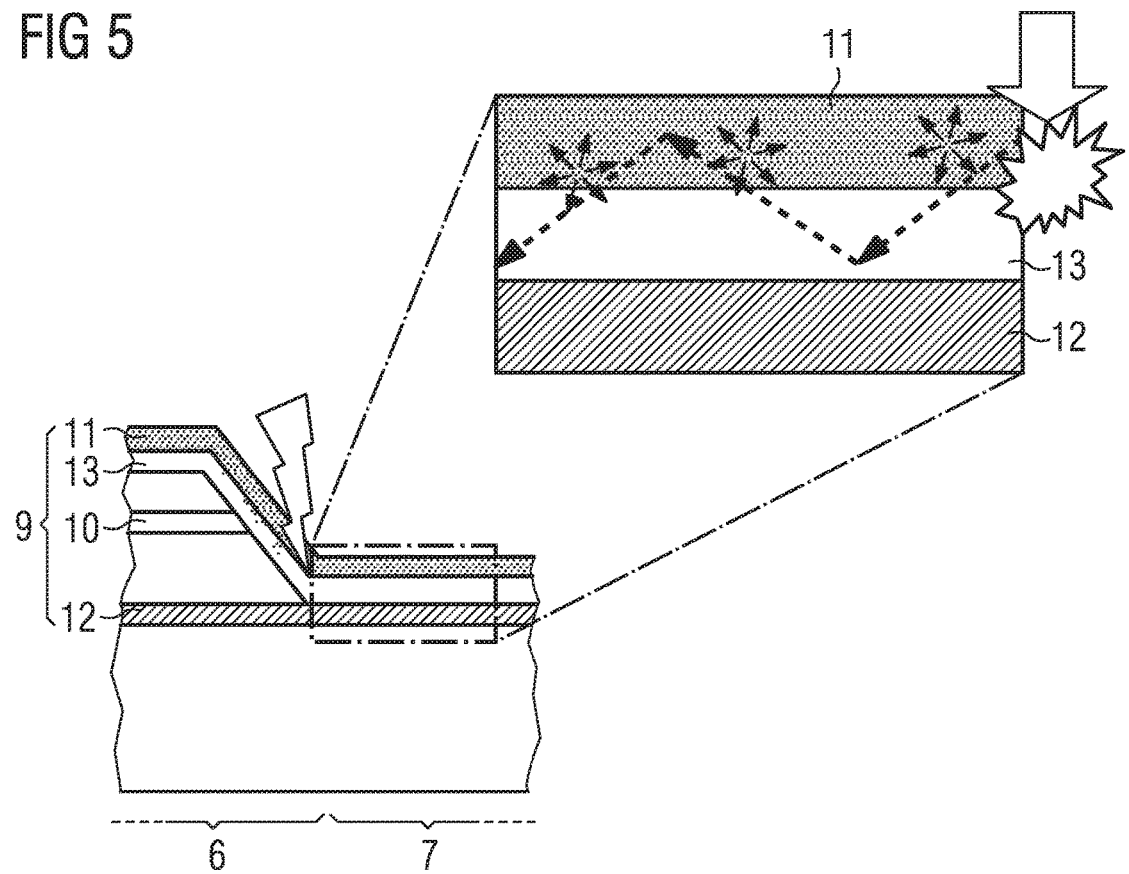
FIG. 5 shows a schematic sectional illustration of an example of another semi-conductor wafer in a method stage.

FIG. 5 shows by way of example a portion taken from a semiconductor wafer comprising a chip region 6 and a separating region 7. The semiconductor wafer will be separated precisely along the separating region 7 by a laser.

The chip region 6 has, as in the example in FIGS. 3A to 3C, an LED structure. The LED structure is a semiconductor layer sequence 9 arranged on a substrate 8. The semiconductor layer sequence 9 comprises, within the chip region 7, an active zone 10 that generates radiation. Furthermore, the semiconductor layer sequence 9 comprises a metallic layer 12 provided, for example, to contact the active zone 10 and/or to reflect radiation generated in the active zone 10.

The metallic layer 12 can, for example, comprise one of the following materials or be formed from one of the following materials or an alloy thereof: platinum, gold, titanium, aluminum or the like. The metallic layer 12 can also be constructed from individual layers (not illustrated in the drawing). By way of example, the metallic layer 12 can be constructed from three individual layers, a platinum layer, a gold layer and a titanium layer.

The reflectivity of the metallic layer 12 is preferably at least about 50%.

The semiconductor layer sequence 9 furthermore comprises an outermost layer 13 provided to protect the subsequent semiconductor chip. The outermost layer 13 may be formed from a material having a high refractive index in comparison with the underlying metallic layer 12. The outermost layer 13 preferably comprises one of the following materials: silicon nitride, silicon oxide. The thickness of the outermost layer 13 is, for example, about 200 nm to about 600 nm.

The outermost layer 13 may have a higher refractive index than the surroundings, the refractive index generally being greater than about 1.

In the example, a suspension layer 11 such as has already been described with reference to FIGS. 1 and 2 is applied over the entire surface of the semiconductor wafer.

During a laser separation method, on account of the comparatively large difference in refractive index between the outermost layer 13 and the underlying metallic layer 12, a waveguide effect in respect of coupled-in laser radiation can occur within the outermost layer 13. Advantageously, the coupled-in laser radiation, by virtue of the suspension layer 11 applied to the outermost layer 13 in direct contact and comprising an additive composed of inorganic particles, is scattered and/or absorbed at the latter. It is thus possible to significantly reduce the waveguide effect within the outermost layer 13 and, hence, damage to the active zone 10 as a result of laser radiation.

Our suspensions and methods are not restricted to the examples by the description on the basis of those examples. Rather, this disclosure encompasses any novel feature and also any combination of features, which in particular includes any combination of features in the appended claims, even if the feature or combination itself is not explicitly specified in the claims or the examples.

What is claimed is:

1. A suspension for protecting a semiconductor material, comprising:
   a carrier medium,
   trimethylolpropane as a plasticizer,
   benzotriazole derivate as an absorber dye, and
   inorganic particles selected from the group consisting of aluminum nitride, silicon nitride and boron nitride, wherein thermal conductivity of the suspension is about 1 W/mk to about 2 W/mk.

2. The suspension according to claim 1, wherein the carrier medium is a polymeric matrix.

3. The suspension according to claim 2, wherein the carrier medium is polyvinyl alcohol.

4. The suspension according to claim 1, further comprising water and/or PGME as a carrier medium and/or solvent.

5. The suspension according to claim 1, wherein the diameter of the inorganic particles is about 8 nm to about 1 μm.

6. The suspension according to claim 1, wherein the proportion of inorganic particles in the suspension is about 1% by weight to about 60% by weight.

7. A suspension for protecting a semiconductor material, comprising:
   a carrier medium,
   trimethylolpropane as a plasticizer,
   benzotriazole derivate as an absorber dye, and
   inorganic particles selected from the group consisting of aluminum nitride, silicon nitride and boron nitride, wherein the thermal conductivity of the suspension is about 1 W/mK to about 2 W/mK and the suspension is not configured for sintering.

* * * * *